United States Patent
Obermeier et al.

[11] Patent Number: 6,097,192
[45] Date of Patent: Aug. 1, 2000

[54] METHOD FOR INITIALIZING SHORT TIME AND GROUNDFAULT PROTECTION HEAT INDEX ACCUMULATORS IN A TRIP UNIT

[75] Inventors: Mark J. Obermeier, Coventry; Paul H. Singer, West Hartford; Michael R. Koller, Plainville, all of Conn.

[73] Assignee: General Electric Company, Schenectady, N.Y.

[21] Appl. No.: 09/035,191

[22] Filed: Mar. 5, 1998

[51] Int. Cl.[7] .................................................. G01R 31/32
[52] U.S. Cl. ............................................. 324/424; 361/94
[58] Field of Search .................................. 324/117, 424; 361/94, 96, 97, 93.2

[56] References Cited

U.S. PATENT DOCUMENTS

| 4,589,052 | 5/1986 | Dougherty | 361/94 |
| 4,814,712 | 3/1989 | Burton et al. | 324/424 |

*Primary Examiner*—Josie Ballato
*Assistant Examiner*—Vincent Q. Nguyen
*Attorney, Agent, or Firm*—Cantor Colburn LLP; Carl B. Horton

[57] ABSTRACT

A method of initializing short time and groundfault protection heat index accumulators to compensate for current flow during the time interval between the application of phase current and application of current measurement and protection algorithms in an electronic trip unit is presented. The electronic trip unit includes a microcontroller and associated ROM having trip unit application code, e.g., main functionality firmware, including initializing parameters, and boot code, stored therein and EEPROM having operational parameter code, e.g., encoded enumerations for parameters such as 50/60 Hz., UL/ANSI/IEC, etc., stored therein. The time internal comprises first and second time components. The first time component is the time between the instant phase currents are applied and the instant the microcontroller is initialized and the second time component is the time between the instant the microcontroller is initialized and the instant the microcontroller begins execution of short time and groundfault algorithms (i.e., protection algorithms). The first time component is approximated by applying an initial current measurement to index a calibrator. The second time component is measured by a counter controlled by the initialization firmware. The first and second time components are applied to the initial current measurement (or a derivative thereof) to determine an initial value (or a component thereof), for short time and/or groundfault heat index accumulators.

8 Claims, 2 Drawing Sheets

METHOD FOR INITIALIZING SHORT TIME AND GROUNDFAULT PROTECTION HEAT INDEX ACCUMULATORS IN A TRIP UNIT

BACKGROUND OF THE INVENTION

The present invention relates generally to trip units. More specifically, the present invention relates to a method of heat index accumulator initialization for short time and groundfault protection algorithms in an electronic trip unit.

Electronic trip units are well known. Electronic trip units typically comprise voltage and current sensors which provide analog signals indicative between the power line signals. The analog signals are converted by an A/D (analog/digital) converter to digital signals which are processed by a microcontroller. The trip unit further includes RAM (random access memory), ROM (read only memory) and EEPROM (electronic erasable programmable read only memory) all of which interface with the microcontroller. The ROM includes trip unit application code, e.g., main functionality firmware, including initializing parameters, and boot code. The EEPROM includes operational parameters for the application code.

These trip units are required to meet certain standards, e.g., UL/ANSI/IEC, which specify a short time delay from the instant power is applied to when a trip unit must be ready to trip. In this context, "short time" delay refers to a specific protection characteristic, i.e. short time vs. long time, instantaneous, or ground fault protection. Although the delay is literally "short", the context of the statement is in reference to the short time protection characteristic curve. The standards also define trip time curves specifying under what conditions a trip must occur.

Short time and groundfault protection heat index accumulators are initialized to compensate for current flow during the time interval between the application of phase current and application of current measurement and protection algorithms. This time interval is assumed to be a predetermined amount of time. This assumed time delay is applied to the initial current measurement (or a derivative thereof) to determine an initial value (or a component thereof, for short time and/or groundfault heat index accumulators, as is well known in the art.

SUMMARY OF THE INVENTION

The above-discussed and other drawbacks and deficiencies of the prior art are overcome or alleviated by the method of initializing short time and groundfault protection heat index accumulators to compensate for current flow during the time interval between the application of phase current and application of current measurement and protection algorithms in an electronic trip unit of the present invention. The electronic trip unit comprising voltage and current sensors which provide analog signals indicative the power signals. The analog signals are converted by an A/D (analog/digital) converter to digital signals which are processed by a microcontroller. The trip unit further includes RAM (random access memory), ROM (read only memory) and EEPROM (electronic erasable programmable read only memory) all of which communicate with the microcontroller. The ROM includes trip unit application code, e.g., main functionality firmware, including initializing parameters, and boot code. The EEPROM includes operational parameter code, e.g., encoded enumerations for parameters such as 50/60 Hz., UL/ANSI/IEC, etc.

In general, trip units are required to meet certain standards, e.g., UL/ANSI/IEC, which specify a short time delay from the instant power is applied to when a trip unit must be ready to trip. These standards also define trip time curves specifying under what conditions a trip must occur. The trip curves are based on temperature which is proportional to current as a function of time.

An object of the present invention is to initialize short time and groundfault protection heat index accumulators to compensate for current flow during the time interval between the application of phase current and application of current measurement and protection algorithms. In accordance with the present invention, this time internal is divided into a first time component and a second time component. The first time component is the time between the instant phase currents are applied and the instant the microcontroller is initialized and the second time component is the time between the instant the microcontroller is initialized and the instant the microcontroller begins execution of short time and groundfault algorithms (i.e., protection algorithms).

The first time component is approximated by applying an initial current measurement to index a calibrator to approximate the first time component as a function of the phase current, CT ratio, and 50 Hz. vs. 60 Hz. application. The second time component is measured by a counter controlled by the initialization firmware. The first and second time components are applied to the initial current measurement (or a derivative thereof) to determine an initial value (or a component thereof), for short time and/or groundfault heat index accumulators, in the same manner the predetermined time delay is employed in the prior art.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
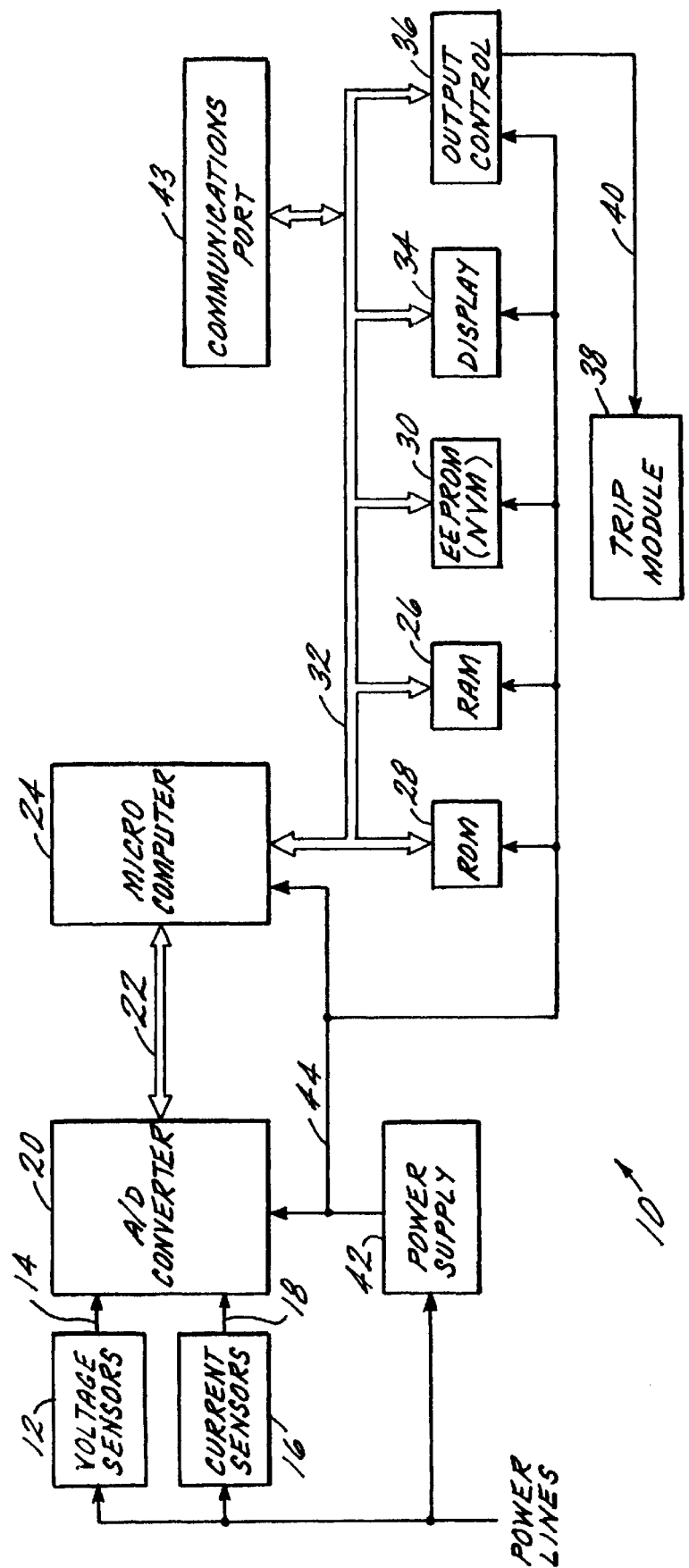
FIG. 1 is a schematic block diagram of an electronic trip unit.

Referring to FIG. 1, a general schematic of a trip unit is generally shown at 10. Trip unit 10 comprises a voltage sensor 12 which provides analog signals indicative of voltage measurements on a signal line 14 and a current sensor 16 which provides analog signals indicative of a current measurements on a signal line 18. The analog signals on line 14 and 18 are presented to an A/D (analog/digital) converter 20, which converts these analog signals to digital signals. The digital signals are presented over a bus 22 to a microcontroller (microcomputer) 24. Trip unit 10 further includes RAM (random access memory) 26, ROM (read only memory) 28 and EEPROM (electronic erasable programmable read only memory) 30 all of which communicate with the microcontroller 24 over a control bus 32. EEPROM 30 is non-volatile so that system information and programming will not be lost during a power interruption or outage. Data, typically the status of the circuit breaker, is displayed by a display 34 in response to display signals received from microcontroller 24 over control bus 32. An output control 36, in response to control signals received from microcontroller 24 over control bus 32, controls a trip module 38 via a line 40. Calibration, testing, programming and other features are accomplished through a communications I/O port 43, which communicates with microcontroller 24 over control bus 32. A power supply 42 which is powered by the service electricity, provides appropriate power over a line 44 to the components of trip unit 10. ROM 28 includes trip unit application code, e.g., main functionality firmware, including initializing parameters, and boot code. EEPROM 30 includes operational parameter code, e.g., encoded enumerations for parameters such as 50/60 Hz., UL/ANSI/IEC, ect. It will be appreciated that these parameters or options are stored in the trip unit at the factory and are selected to meet customers' requirements.

Trip units are required to meet certain standards, e.g., UL/ANSI/IEC, which specify a short time delay (designated "c" in FIG. 2) from the instant power is applied to when a trip unit must be ready to trip. This short time delay differs for each of the standards. These standards also define trip curves specifying under what conditions a trip must occur. The trip curves are based on temperature which is proportional to current as a function of time.

Figure 2:
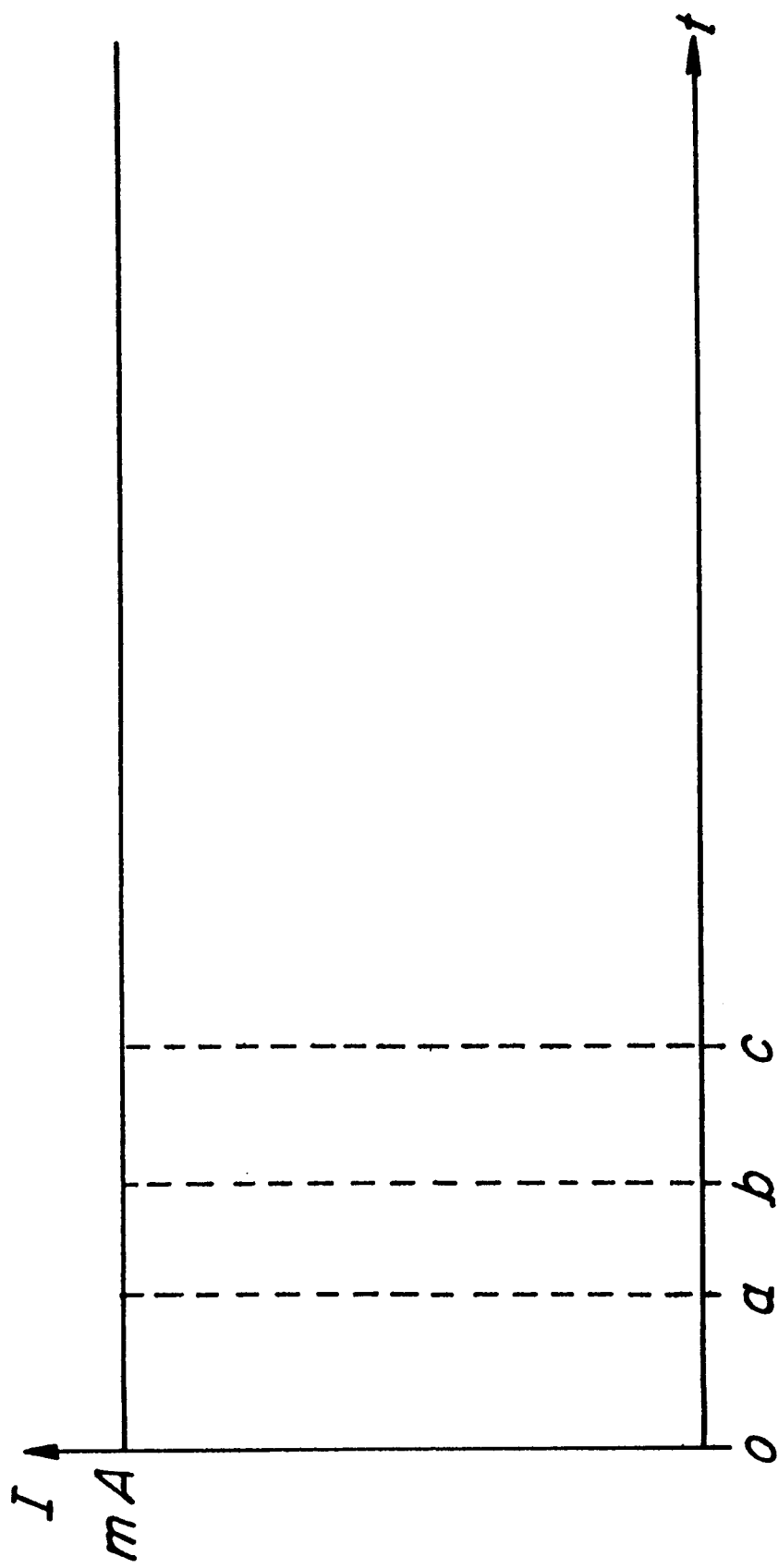
FIG. 2 is a plot of current versus time in accordance with the present invention.

Referring to FIG. 2, in general, an object of the present invention is to initialize short time and groundfault protection heat index accumulators to compensate for current flow during the time interval between the application of phase current and application of current measurement and protection algorithms. In accordance with the present invention, this time interval is divided into a first time component "a" and a second time component "b". The first time component is the time between the instant phase currents are applied and the instant microcontroller 24 is initialized, i.e., comes out of reset and begins executing instructions, and the second time component is the time between the instant microcontroller 24 is initialized and the instant microcontroller 24 begins execution of short time and groundfault algorithms (i.e., protection algorithms).

The first time component is primarily dependent upon hardware design architecture and components. The first time component is approximated by applying an initial current measurement to index a calibrator, i.e. an equation or a digitized form of an equation such as a calibration table. The index calibrator provides an approximation of the first time component as a function of the phase current, CT ratio and line frequency (i.e., 50 Hz. vs 60 Hz.) The initial current measurement is requested by the initialization firmware. Once initialization functions necessary to facilitate sampling (measurements), and consequently the application of protection algorithms, has been performed, the initialization firmware enables interrupts to initiate data sampling (measurement) and protection algorithm scheduling. An initial relative current value is determined from a peak sample. A rating plug ratio is applied to determine an absolute initial current value. A calibration table offset is determined by comparing the absolute current value to various reference values selected as a function of application, i.e., line frequency. An appropriate calibration table base address is selected as a function of line frequency (e.g., 60 Hz. or 50 Hz.) and current sensor rating (e.g., 100 mA, 200 mA, 400 mA, etc.). The offset is added to the base address to develop an index into one of the tables which provide delay factors, in units of half-cycles, as a function of current. Although only two tables are described herein for defining delay as a function of current, i.e., one for 50 Hz. applications and another for 60 Hz. applications, the present invention is not so limited. An array of tables is preferred over the mathematical manipulation (which would be necessary in developing a normalized table indexing factor) to reduce a real-time processing overhead associated with this function. The delay factor is stored for application during initial execution of short time and groundfault protection algorithms in developing initial values for the short time and groundfault heat index accumulators, respectively. When the short time and groundfault protection algorithms are executed for the first time, the short time heat index and groundfault heat index accumulators are initiated.

The second time component is primarily dependent upon software design architecture and coding methodologies. The second time component is measured by a counter (which is internal to microcontroller 30 in the present example) controlled by the initialization firmware.

The first and second time components are applied to the initial current measurement (or a derivative thereof) to determine an initial value (or a component thereof), for short time and/or groundfault heat index accumulators. A derivative of the initial current measurement is applied to a composite of the time components to define initial values for each of the accumulators (i.e., short time and groundfault heat index accumulators). By way of example, derivatives of the initial current measurement include, (1) applying a peak current sample from a first half-cycle of the phase current to develop an RMS equivalent of the phase current and (2) applying a vector sum of multiple phase currents sampled during a first half-cycle to develop an RMS equivalent of the phase currents. The derivatives from the initial current samples for the short time and groundfault heat index accumulators are applied to form initial values for their respective heat index accumulators, in the same manner the predetermined time delay is employed in the prior art (such being well known).

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of initializing accumulators to compensate for current flow during the time interval between application of a phase current and initialization of protection algorithms in an electronic trip unit, the method comprising:

measuring a current to provide an initial current measurement;

approximating a first time interval, in response to said initial current measurement said first time interval is the time between application of said current and electronic initialization of the accumulator;

measuring a second time interval, said second time interval is the time between electronic initialization of said trip unit and execution by said trip unit of said protection algorithms; and initializing said accumulators based on said first and second time intervals.

2. The method of claim 1 wherein measuring a second time interval comprises initializing a counter to zero and based upon a clock frequency measuring the second time interval.

3. The method of claim 1 wherein said protection algorithms comprises short time and groundfault protection algorithms.

4. The method of claim 1 wherein said accumulators comprise accumulators operative to simulate the heat generated by the measured current over the first measured time interval.

5. The method of claim 1 wherein said initial current measurement comprises a peak current measurement over one half of a cycle thereof.

6. The method of claim 1 further comprising:

estimating the RMS value of said initial current measurement wherein applying said initial current measurement to said accumulator comprises applying said estimated RMS value of said initial current to said accumulator.

7. The method of claim 6 wherein:

estimating the RMS value of the initial current measurement comprises estimating said RMS value from a peak current measurement.

8. The method of claim 5 wherein:

measuring a current to provide an initial current measurement comprises measuring a plurality of phase currents; and estimating the RMS value of said initial current comprises applying a vector sum of the phase currents to estimate the RMS value.

* * * * *